US008922313B2

(12) United States Patent
Moiseev et al.

(10) Patent No.: US 8,922,313 B2

(45) Date of Patent: Dec. 30, 2014

(54) INDUCTION DEVICE

(75) Inventors: Sergey Moiseev, Aichi-ken (JP); Yasuhiro Koike, Aichi-ken (JP); Hiroaki Asano, Aichi-ken (JP); Kiminori Ozaki, Aichi-ken (JP); Masanori Tsuzaka, Aichi-ken (JP); Shimpei Sakoda, Aichi-ken (JP)

(73) Assignee: Kabushiki Kaisha Toyota Jidoshokki, Aichi-Ken (JP)

( * ) Notice: Subject to any disclaimer, the term of this patent is extended or adjusted under 35 U.S.C. 154(b) by 0 days.

(21) Appl. No.: 13/328,215

(22) Filed: Dec. 16, 2011

(65) Prior Publication Data

US 2012/0161911 A1 Jun. 28, 2012

(30) Foreign Application Priority Data

Dec. 24, 2010 (JP) ................................ 2010-287471

(51) Int. Cl.

| | |
|---|---|
| ***H01F 27/02*** | (2006.01) |
| ***H01F 5/00*** | (2006.01) |
| ***H01F 27/28*** | (2006.01) |
| ***H05K 7/14*** | (2006.01) |

(52) U.S. Cl.

CPC ............ *H01F 27/2804* (2013.01); *H01F 27/02* (2013.01)

USPC ............. 336/90; 336/200; 336/232; 336/223; 174/535

(58) Field of Classification Search

CPC ....................................................... H01F 27/02

USPC ........................... 336/200, 223, 232; 174/535

See application file for complete search history.

(56) References Cited

U.S. PATENT DOCUMENTS

| | | | | |
|---|---|---|---|---|
| 4,012,703 | A * | 3/1977 | Chamberlayne ............ | 333/24 R |
| 6,380,836 | B2 * | 4/2002 | Matsumoto et al. .......... | 336/200 |
| 6,565,382 | B1 * | 5/2003 | Blodgett et al. .............. | 439/547 |
| 6,696,909 | B2 * | 2/2004 | Inoue et al. .................... | 336/200 |
| 7,468,648 | B2 * | 12/2008 | Springett ...................... | 336/200 |
| 8,188,829 | B2 | 5/2012 | Nakahori et al. | |
| 2010/0007358 | A1 * | 1/2010 | Schaerrer et al. ............. | 324/649 |

FOREIGN PATENT DOCUMENTS

| | | |
|---|---|---|
| CN | 101770853 | 7/2010 |
| JP | 6-9111 | 2/1994 |
| JP | 2001-015350 | 1/2001 |
| JP | 2003-244959 | 8/2003 |
| JP | 2007-006635 | 1/2007 |
| JP | 2010-003926 | 1/2010 |
| JP | 2010-153722 | 7/2010 |
| JP | 2010-178439 | 8/2010 |
| JP | 2010178439 A * | 8/2010 |
| JP | 2011-077328 | 4/2011 |

OTHER PUBLICATIONS

Korean Office action, mail date is Oct. 24, 2013.

(Continued)

*Primary Examiner* — Elvin G Enad

*Assistant Examiner* — Ronald Hinson

(74) *Attorney, Agent, or Firm* — Greenblum & Bernstein, P.L.C.

(57) ABSTRACT

An induction device includes a casing, a coil retainer, a coil that is disposed in the casing and retained to the coil retainer and a core that is disposed in the casing. The coil extends spirally around the core. The core and the coil retainer are fixed to the casing separately.

9 Claims, 4 Drawing Sheets

(56) References Cited

OTHER PUBLICATIONS

Chinese Office action, mail date is Nov. 15, 2013, along with English-language translation thereof.

Japanese Office action, mail date is Nov. 26, 2013.

Chinese Office Action having mailing date of Jul. 28, 2014 (English-language translation).

* cited by examiner

FIG.1B A-A cross-section

FIG.2B A-A cross-section

FIG.3B (A–A CROSS–SECTION)

FIG.3C (B–B CROSS–SECTION)

(A-A CROSS-SECTION)

(B-B CROSS-SECTION)
100
110
111
111A
112
112A
113A
113B
113C
113D
113A(113B)
113C
(113D)
120
121
122
123
124
130
131
131A
131B
131C
131D
132
140
150
151
C10
C11
C10 (C11)
F10
A
B

INDUCTION DEVICE

BACKGROUND OF THE INVENTION

The present invention relates to an induction device.

Japanese Utility Model Publication H06-9111 discloses a transformer that includes a printed-circuit board, a coil formed by a conductive pattern on the printed-circuit board, a subsidiary board disposed above the coil on the printed-circuit board and another coil formed by a conductive pattern on the subsidiary board. A pair of upper and lower cores are fixed to the printed-circuit board in such a way that the cores face each other and hold therebetween the printed-circuit board and the subsidiary board in the region of the coil.

In the above structure wherein the cores are fixed directly to the printed-circuit board, there is a fear that the cores and the printed-circuit board may be broken by heat stress generated by the difference of thermal expansion coefficient between the cores and the printed-circuit board. The present invention is directed to providing an induction device having cores and a coil retainer that are hardly susceptible to the heat stress generated by the difference of the thermal expansion coefficient between the cores and the coil retainer.

SUMMARY OF THE INVENTION

An induction device includes a casing, a coil retainer, a coil that is disposed in the casing and retained to the coil retainer and a core that is disposed in the casing. The coil extends spirally around the core. The core and the coil retainer are fixed to the casing separately.

Other aspects and advantages of the invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention together with objects and advantages thereof, may best be understood by reference to the following description of the presently preferred embodiments together with the accompanying drawings in which:

FIG. 1B is a cross-sectional view taken along the line A-A in FIG. 1A;

FIG. 2B is a cross-sectional view taken along the line A-A in FIG. 2A;

FIG. 3B is a cross-sectional view taken along the line A-A in FIG. 3A;

FIG. 3C is a cross-sectional view taken along the line B-B in FIG. 3A;

DETAILED DESCRIPTION OF THE PREFERRED EMBODIMENTS

Figure 1A:
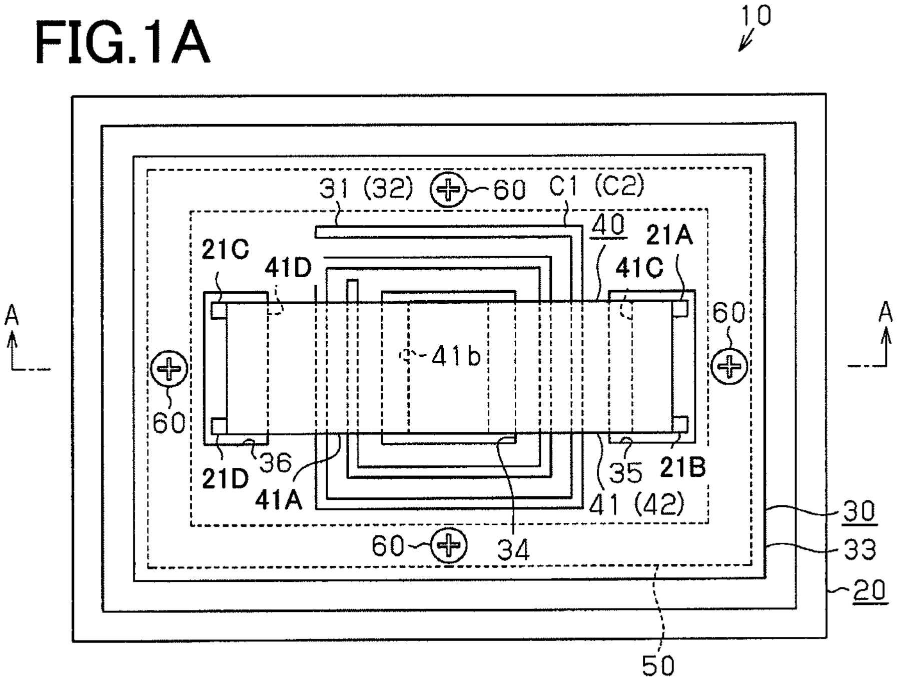
FIG. 1A is a plan view of a transformer according to a first embodiment of the present invention.
Figure 1A:
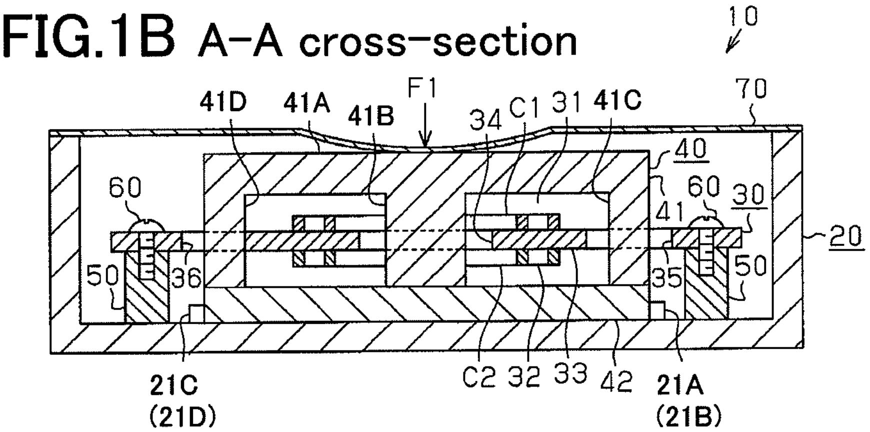
Figure 2A:
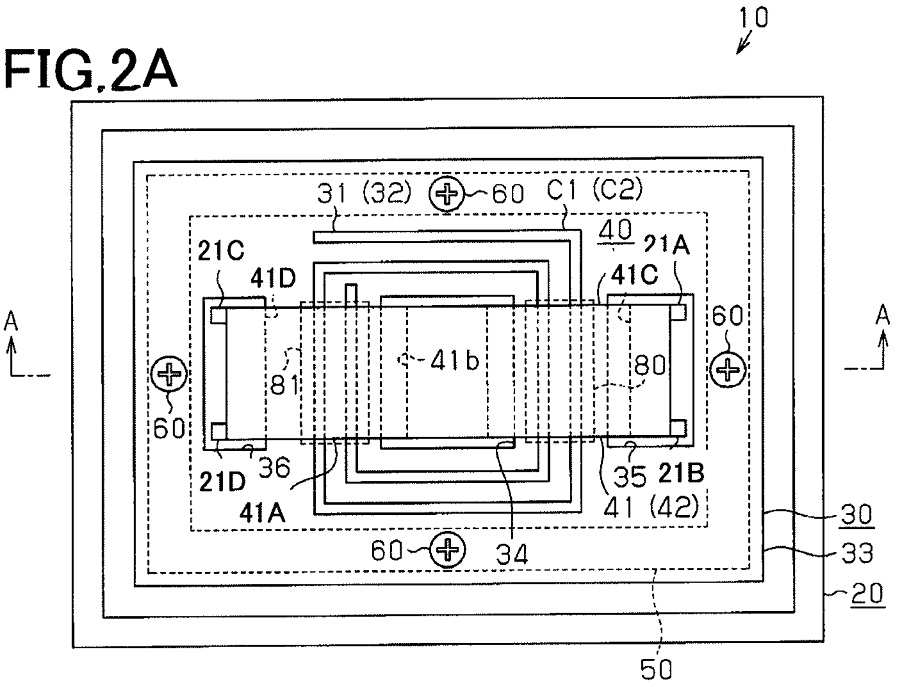
FIG. 2A is a plan view of a transformer according to an alternative embodiment derived from the first embodiment.
Figure 2A:
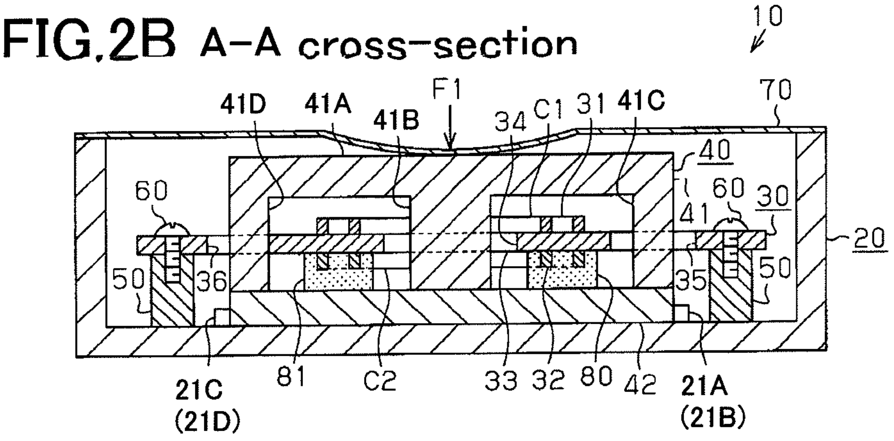

The following will describe the transformer as an induction device according to the first embodiment of the present invention with reference to FIGS. 1 and 2. As shown in FIG. 1, the transformer which is generally designated by numeral 10 includes a casing 20, a copper plate 30 having primary and secondary coils C1, C2 and a core 40. The casing 20 is formed in the shape of a box having an opening at the top.

The copper plate 30 and the core 40 are disposed in the casing 20. The copper plate 30 includes a primary copper plate 31 forming the primary coil C1 and a secondary copper plate 32 forming the secondary coil C2. The primary coil C1 and the secondary coil C2 are formed around the core 40.

The copper plate 30 further includes an insulating substrate 33 made of a glass-epoxy resin. The primary copper plate 31 is joined to the upper surface of the insulating substrate 33 and the primary coil C1 is formed on the primary copper plate 31 by patterning.

The secondary copper plate 32 is joined to the surface of the insulating substrate 33 opposite from the primary copper plate 31 and the secondary coil C2 is formed on the secondary copper plate 32 by patterning. The primary coil C1 and the secondary coil C2 are retained to the insulating substrate 33 serving as a coil retainer. The copper plate 30 is formed in such a way that the primary copper plate 31, the secondary copper plate 32 and the insulating substrate 33 are formed integrally.

The core 40 is of an E-I type including an E-type core 41 and an I-type core 42. The E-type core 41 includes a horizontal main portion 41A in the form of a rectangular plate and a center leg portion 41B and side leg portions 41C, 41D extending downward from the center and the opposite ends of the main portion 41A and parallel to each other. Each of the center leg portion 41B and the side leg portions 41C, 41D of the E-type core 41 is rectangular-shaped in cross-section.

The I-type core 42 is shaped in the form of a rectangular plate and disposed horizontally. The center leg portion 41B and the side leg portions 41C, 41D are in contact at the end surfaces thereof with the upper surface of the I-type core 42. Thus, a closed circuit of the E-Itype core is formed.

The insulating substrate 33 of the copper plate 30 has formed therethrough at the center thereof a hole 34 through which the center leg portion 41B passes. The primary coil C1 formed on the primary copper plate 31 of the copper plate 30 is formed by a single conductive wire extending spirally around the hole 34 of the insulating substrate 33 and hence around the center leg portion 41B of the E-type core 41 for a plurality of turns. Similarly, the secondary coil C2 is formed on the secondary copper plate 32 of the copper plate 30 by a single conductive wire extending spirally around the center leg portion 41B of the E-type core 41 for a plurality of turns. Thus, the core 40 has the center leg portion 41B around which the primary coil C1 and the secondary coil C2 are wound.

In addition to the hole 34, the insulating substrate 33 of the copper plate 30 has also formed therethrough holes 35, 36 through which the side leg portions 41C, 41D are passed, respectively. The holes 34, 35, 36 of the insulating substrate 33 of the copper plate 30 are formed with areas that are larger than the cross-sectional areas of the center and the side leg portions, 41B, 41C, 41D, respectively.

The casing 20 that is formed in the shape of a box having the opening at the top is made of an aluminum alloy. The I-type core 42 is disposed on the bottom of the casing 20. Projections 21A, 21B, 21C, 21D are formed extending upward from the bottom of the casing 20 to be used for positioning the I-type core 42. More particularly, the projections 21A, 21B are provided at one short side of the I-type core 42 and the projections 21C, 21D are provided at the other short side of the I-type core 42 so as to position the I-type core 42 in place on the bottom of the casing 20 by the contact between the projections 21A, 21B and one short side of the I-type core 42 and also between the projections 21C, 21D and the other short side of the I-type core 42, respectively. as shown in FIGS. 1A and 1B.

A support member 50 for fixing the copper plate 30 is disposed outward of the I-type core 42 on the bottom of the casing 20. The support member 50 is formed in the shape of a rectangular frame and fixed to the bottom of the casing 20 so as to surround the I-type core 20.

The copper plate 30 is mounted on the upper surface of the support member 50 and fixed to the support member 50 by screws 60 that are passed through the insulating substrate 33 of the copper plate 30 and screwed into the support member 50. Thus, the copper plate 30 is fixedly mounted to the support member 50, so that the insulating substrate 33 of the copper plate 30 is fixed to the casing 20.

In this case, the copper plate 30 is positioned above the I-type core 42 at a spaced distance. The center leg portion 41B of the E-type core 41 is passed through the hole 34 of the insulating substrate 33 of the copper plate 30. The primary coil C1 formed on the primary copper plate 31 of the copper plate 30 is spaced away from the lower surface of the main portion 41A of the E-type core 41 by a clearance and the secondary coil C2 formed in the secondary copper plate 32 of the copper plate 30 is also spaced away from the upper surface of the I-type core 42 by a clearance.

As shown in FIG. 1B, a cover 70 is mounted to the top of the casing 20 so as to close the opening thereof and urge the E-type core 41 downward by its spring force indicated by F1. The E-type core 41 is held against the I-type core 42. In other words, the core 40 is urged downward by the cover 70 thereby to be fixed to the casing 20. For the sake of convenience of illustration, the cover 70 shown in FIG. 1B is omitted in FIG. 1A.

The E-type core 41 is in contact at the inner surface of the side leg portion 41D thereof with one side of the inner surface of the hole 36 formed through the insulating substrate 33 of the copper plate 30 so that E-type core 41 is positioned horizontally in place by the contact between the side leg portion 41D of the E-type core 41 and the insulating substrate 33 of the copper plate 30. The core 40 and the copper plate 30 (or the insulating substrate 33) are fixed to the casing 20 separately. Specifically, the E-type core 41 is not directly fixed to the insulating substrate 33 of the copper plate 30. Heat insulation and electrical insulation between the primary and the secondary coils C1, C2 and the core 40 are accomplished by the provision of the clearance formed between the primary and the secondary coils C1, C2 and the core 40.

The following will describe an assembly method and the operation of the transformer 10. In assembling the transformer 10, the casing 20, the copper plate 30, the E-type core 41, the I-type core 42 and the cover 70 are prepared. The casing 20 is already provided with the projections 21A through 21D and the support member 50.

The I-type core 42 is disposed on the bottom of the casing 20 and positioned by the projections 21A through 21D of the casing 20. Subsequently, the copper plate 30 is placed on the support member 50 on the bottom of the casing 20 and fixed to the support member 50 by the screws 60.

Next, the E-type core 41 is disposed on the I-type core 42 with the center and the side leg portions 41B, 41C, 41D of the E-type core 41 passed through the holes 34, 35, 36 of the copper plate 30, respectively.

Next, the cover 70 is fixed to the top of the casing 20 so as to close the opening thereof and so that the E-type core 41 is urged downward by the spring force F1 exerted by the cover 70 and the core 40 is held in the casing 20 with the E-type core 41 disposed on the I-type core 42. Thus, the assembling of the transformer 10 is completed.

During the operation of the transformer 10 when the primary and the secondary coils C1, C2 of the transformer 10 are energized, heat is generated by the primary and the secondary coils C1, C2 (or the primary and the secondary copper plates 31, 32) and the generated heat is released to the atmosphere. On the other hand, the heat of the core 40 is released to the casing 20 through the I-type core 42. Thus, the path for releasing the heat from the primary and the secondary coils C1, C2 differs from that for releasing the heat from the core 40.

The thermal expansion coefficients of the core 40 and the insulating substrate 33 differ from each other. The core 40 and the copper plate 30 which are fixed to the casing 20 separately are hardly subjected to stress due to the difference of thermal expansion coefficient of the core 40 and the insulating substrate 33.

The induction device 10 according to the first embodiment of the present invention offers the following advantageous effects.

(1) The core 40 and the insulating substrate 33 serving also as the coil retainer for the primary and the secondary coils C1, C2 are fixed to the casing 20 separately. The core 40 is not fixed to the insulating substrate 33 directly and, therefore, the core 40 and the insulating substrate 33 are hardly subjected to stress due to the difference of thermal expansion coefficient of the core 40 and the insulating substrate 33.

(2) The substrate (or the insulating substrate 33) serves as the coil retainer and the coil is held at least on either one of the surfaces of the substrate (or the insulating substrate 33) so that the coil is held appropriately. In other words, the coil is held easily by the substrate.

The following will describe an alternative embodiment derived from the first embodiment. In the alternative embodiment, heat-conducting members 80, 81 are interposed between the secondary coil C2 and the I-type core 42, as shown in FIG. 2B. The heat-conducting members 80, 81 are made of a material having electrical insulation and low thermal resistance. For example, a heat radiating sheet or grease may be used as the heat-conducting members 80, 81.

The heat-conducting members 80, 81 are interposed between the secondary coil C2 and the I-type core 42, so that the heat generated by the secondary coil C2 can be released easily to the I-type core 42 through the heat-conducting members 80, 81.

This structure of FIGS. 2A and 2B having the heat-conducting members 80, 81 ensures electrical insulation between the I-type core 42 and the secondary coil C2, but allows the heat of the secondary coil C2 to be released to the I-type core 42 positively.

The following will describe the transformer as an induction device according to the second embodiment of the present invention with reference to FIGS. 3 and 4. As shown in FIG. 3, the transformer is generally designated by numeral 100. Like the first embodiment, the transformer 100 includes a cupper plate 120 and a core 130 and a casing 110 serves as a radiating member for releasing the heat generated by the transformer 100. The transformer 100 according to the second embodiment differs from the transformer 10 according to the first embodiment in that an insulating substrate 123 as a coil retainer is fixed to the casing 110 only at positions outward of the long side surfaces of the core 130 of an elongated shape.

Figure 3A:
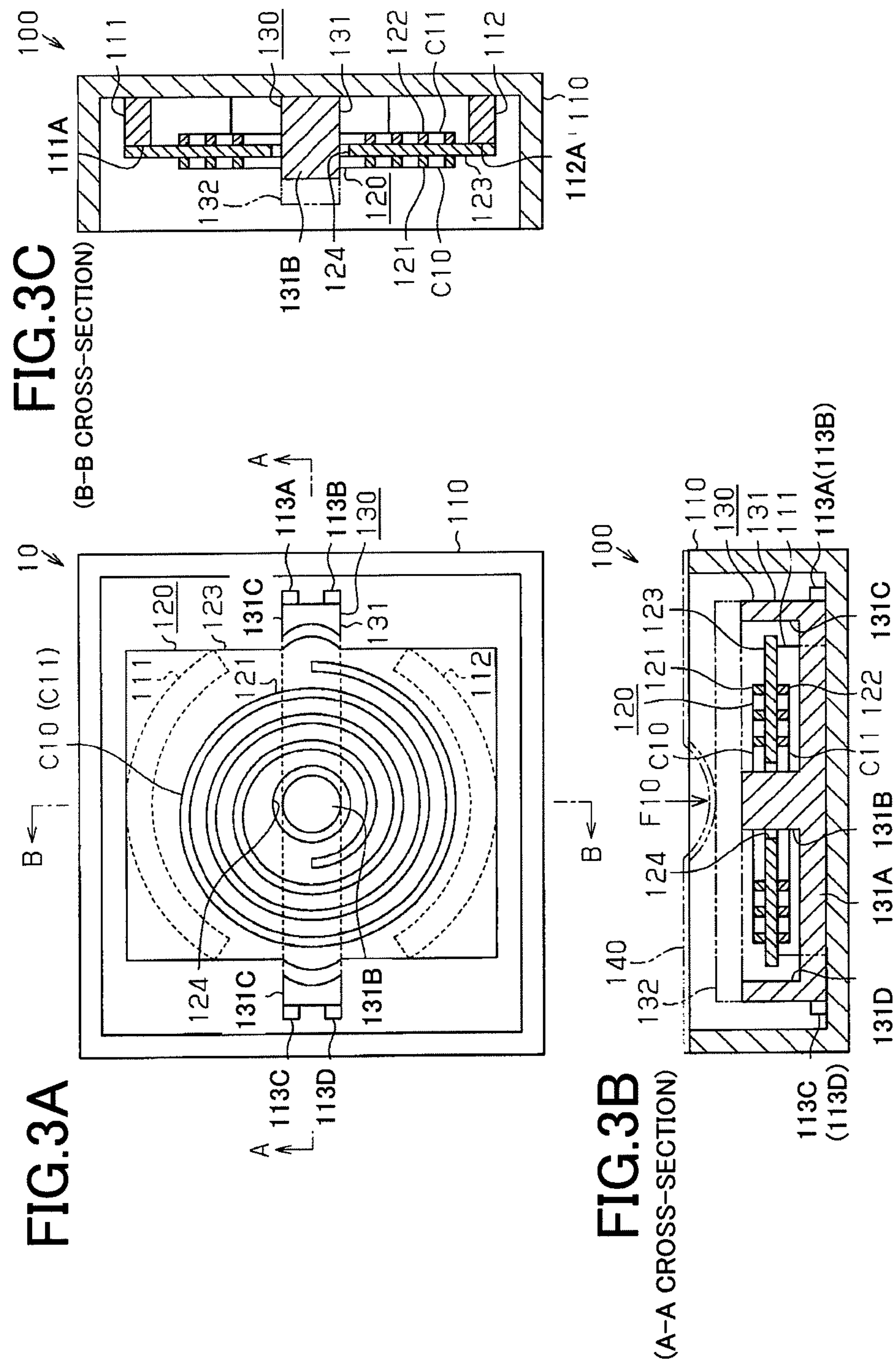
FIG. 3A is a plan view of a transformer according to a second embodiment of the present invention.

Referring to FIG. 3, the core 130 is of an E-I type including an E-type core 131 and an I-type core 132. The I-type core 132 is shown by chain double-dashed line in FIGS. 3B, 3C and omitted in FIG. 3A.

The copper plate 120 includes a primary copper plate 121, a secondary copper plate 122 and the insulating substrate 123. The primary copper plate 121 is joined to the upper surface of the insulating substrate 123 and a primary coil C10 is formed on the primary copper plate 121 by patterning. The secondary copper plate 122 is joined to the surface of the insulating substrate 123 opposite from the primary copper plate 121 and a secondary coil C2 is formed on the secondary copper plate 122 by patterning. The copper plate 120 is formed in such a way that the primary copper plate 121, the secondary copper plate 122 and the insulating substrate 123 are formed integrally.

The casing 110 is formed in the shape of a box having an opening at the top. The E-type core 131 is disposed on the bottom of the casing 110. The E-type core 131 includes a horizontal main portion 131A in the form of a rectangular plate and a center leg portion 131B and side leg portions 131C, 131D extending upward from the center and the opposite ends of the upper surface of the main portion 131A and parallel each other. The cross-section of the center leg portion 41B is circular-shaped. The I-type core 132 is shaped in the form of a rectangular plate extending horizontally.

The casing 110 is made of an aluminum alloy. Support members 111, 112 in the form of an arc are formed projecting upward from the bottom of the casing 110 at positions that are symmetrical about the center leg portion 131B of the E-type core 131. The upper surfaces 111A, 112A of the respective support members 111, 112 are plain and level with each other.

The copper plate 120 is disposed on the upper surfaces 111A, 112A of the support members 111, 112. The insulating substrate 123 of the copper plate 120 is fixed to the support members 111, 112 of the casing 110 by screws (not shown).

The insulating substrate 123 of the copper plate 120 has formed therethrough at the center thereof a hole 124 through which the center leg portion 131B of the E-type core 131 passes. The primary coil C1 formed on the primary copper plate 121 of the copper plate 120 is formed by a single conductive wire extending spirally around the hole 124 of the insulating substrate 123 and hence around the center leg portion 131B of the E-type core 131 for a plurality of turns. Similarly, the secondary coil C2 formed on the secondary copper plate 122 of the copper plate 120 is formed by a single conductive wire extending spirally around the hole 124 of the insulating substrate 123 and hence around the center leg portion 131B of the E-type core 131 for a plurality of turns.

Projections 113A, 113B, 113C, 113D are formed projecting upward from the bottom of the casing 110 to be used for positioning the E-type core 131. More particularly, for positioning the E-type core 131, the projections 113A, 113B are provided at one short side of the E-type core 131 of a rectangular shape and the projections 113C, 113D are provided at the other short side of the E-type core 131 so that the E-type core 131 is positioned by the contact between the projections 113A, 113B and the one short side of the E-type core 131 and the contact between the projections 113C, 113D and the other short side of the E-type core 131.

As shown in FIG. 3B, a cover 140 is mounted to the top of the casing 110 so as to close the opening thereof and urge the I-type core 132 downward by its spring force F10. Thus, the I-type core 132 is held against the E-type core 131. In other words, the core 130 is urged downward by the cover 140 thereby to be fixed to the casing 110. For the sake of convenience of illustration, the cover 140 shown in FIG. 3B is omitted in FIGS. 3A, 3C.

The induction device 100 according to the second embodiment of the present invention is advantageous in that the insulating substrate 123 is fixed to the casing 110 only at positions outward of the long side surfaces of the core 130 of an elongated shape.

Figures 4A, 4B, 4C:
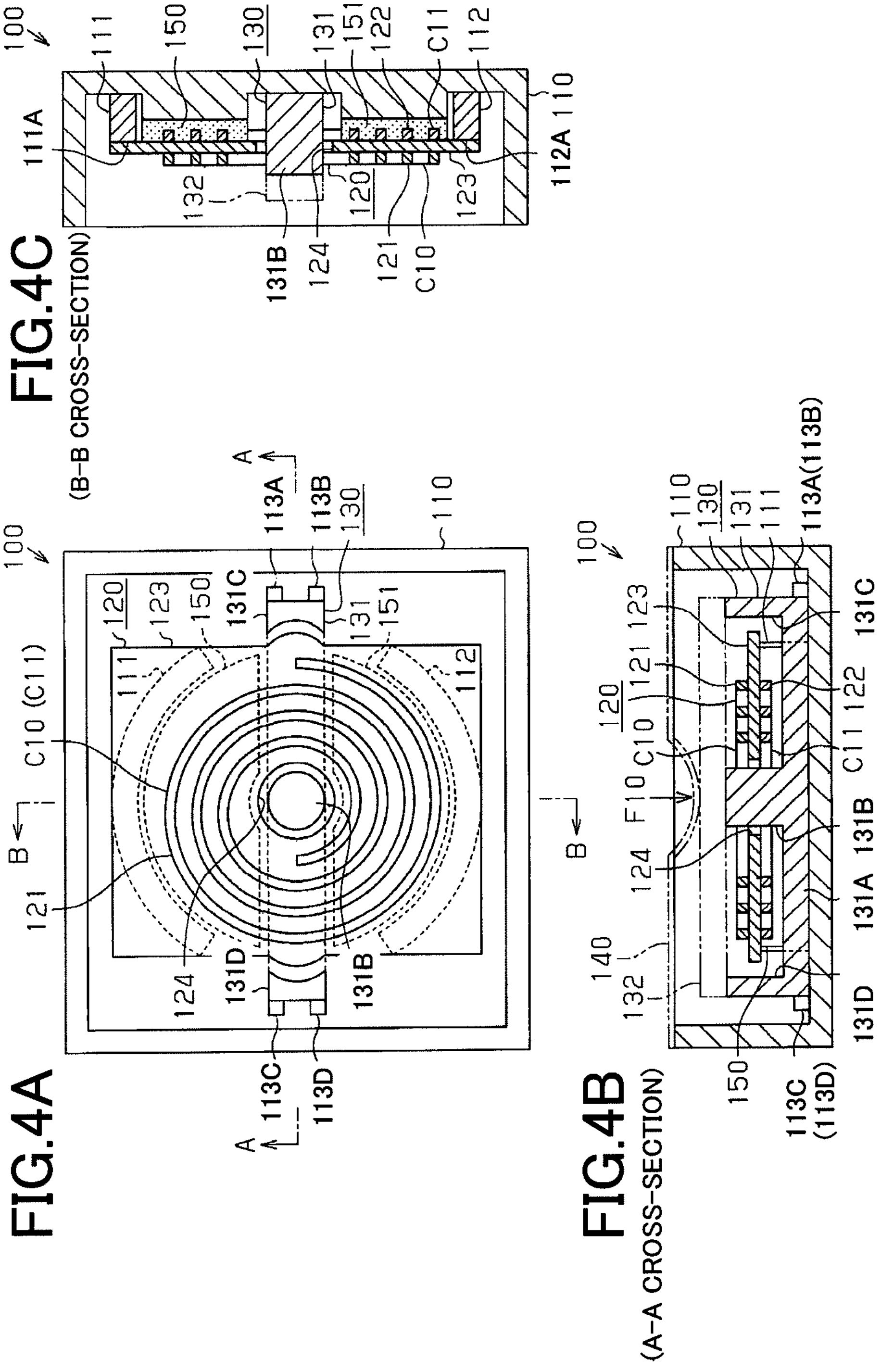
FIG. 4A is a plan view of a transformer according to an alternative embodiment derived from the second embodiment.
FIG. 4B is a cross-sectional view taken along the line A-A in FIG. 4A.
FIG. 4C is a cross-sectional view taken along the line B-B in FIG. 4A.

The following will describe an alternative embodiment derived from the second embodiment. In the alternative embodiment, heat-conducting members 150, 151 are interposed between the secondary coil C11 and the casing 110, as shown in FIGS. 4A, 4C. The heat-conducting members 150, 151 are made of a material having electrical insulation and low thermal resistance. For example, a heat radiating sheet or grease may serve as the heat-conducting members 150, 151. A part of the bottom of the casing 110 facing the secondary coil C11 is formed to be thick so as to reduce the distance between the secondary coil C11 and the bottom of the casing 110, as shown in FIG. 4C.

In this structure of the transformer 100, heat generated by the secondary coil C11 can be released easily to the casing 110 through the heat-conducting members 150, 151.

The present invention is not limited to the above embodiments but may be variously modified within the scope of the invention, as exemplified below.

Like the transformer 100 according to the second embodiment, in the transformer 10 according to the first embodiment, a heat-conducting member may be provided between the casing 20 and the secondary coil C2.

In the first and the second embodiments, a heat-conducting member may be provided between the core and the coil and between the casing and the core.

In the above first and the second embodiments, the primary and the secondary coils C1, C2 are provided on the opposite surfaces of the insulating substrate (or the copper plate 30, 120). However, the coil may be provided on either one of the surfaces of the insulating substrate.

In the above embodiments, the copper plates 30, 120 include the first and the second copper plates that are joined to the opposite surfaces of the insulating substrate. According to the present invention, however, aluminum plates may be joined to the opposite surfaces of the insulating substrate instead of the first and the second copper plates. Additionally, a printed circuit board may be used instead of the copper plate.

Instead of the copper plate (or the printed-circuit board), a coil may be molded by resin. In this case, the resin may form a part of a coil retainer to hold the coil.

The substrate may be fixed by any suitable fixing mean other than the screw.

The present invention has been described as applied to a transformer as an induction device, but the invention may be applied to a reactor. More particularly, the primary and the secondary coils C1, C2 are disposed on the opposite surfaces of the insulating substrate and the primary and the secondary coils C1 and C2 are electrically connected, thereby forming a reactor.

What is claimed is:

1. An induction device comprising:

a casing;

an upward extending projection provided on a bottom of the casing;

a support member provided on the bottom of the casing and disposed at an outer side of the projection so as to be positioned between the casing and the projection;

a coil retainer;

a coil disposed in the casing and retained to the coil retainer such that the coil and the coil retainer are configured as a plate;

a screw extending through the coil retainer and fixed within the casing; and a core disposed in the casing so as to contact an inside surface of the casing, wherein the coil extends spirally around the core, the core abuts the projection and the coil retainer is mounted on an upper surface of the support member at the outer side of the projection such that the core and the coil retainer are fixed within the casing separately, the coil is held on at least one surface of opposing surfaces of the coil retainer, and opposite surfaces of the plate are spaced away from the core in a direction perpendicular to the plate.

2. The induction device according to claim 1, wherein the coil retainer is an insulating substrate and the coil is held on at least one surface of opposing surfaces of the insulating substrate.

3. The induction device according to claim 1, further comprising:

a heat-conducting member interposed between the coil and the core.

4. The induction device according to claim 1, further comprising:

a heat-conducting member interposed between the coil and the casing.

5. The induction device according to claim 3, wherein the heat-conducting member is made of a heat radiating sheet.

6. The induction device according to claim 1, wherein the coil and the coil retainer are formed integrally.

7. The induction device according to claim 1, further comprising:

a cover; and the casing further including:

an opening provided in top of the casing, wherein the cover is fixed to the casing so as to close the opening and urge the core downward so that the core is held in the casing, and wherein the coil retainer is fixed to the support member.

8. The induction device according to claim 1, wherein the coil is made of a copper plate.

9. The induction device according to claim 1, wherein resin forms a part of the coil retainer.

* * * * *